United States Patent [19]

Isobe et al.

[11] Patent Number: 4,607,229
[45] Date of Patent: Aug. 19, 1986

[54] PHASE SHIFTER

[75] Inventors: Seiji Isobe, Kanagawa; Seiji Okubo, Yokohama, both of Japan

[73] Assignee: Kabushiki Kaisha Toshiba, Tokyo, Japan

[21] Appl. No.: 669,328

[22] Filed: Nov. 8, 1984

[30] Foreign Application Priority Data

Dec. 21, 1983 [JP] Japan ............................ 58-241384

[51] Int. Cl.$^4$ .......................... H03K 5/13; H03K 5/22
[52] U.S. Cl. .................................. 328/155; 328/133; 307/262; 307/513
[58] Field of Search ............... 307/262, 511, 513, 529; 328/155, 140, 156, 160, 133

[56] References Cited

U.S. PATENT DOCUMENTS 3,537,015 10/1970 Jackson ........................... 328/160
3,701,012 10/1972 Lang ................................ 328/140
4,394,626 7/1983 Kurihara et al. ................. 331/12

FOREIGN PATENT DOCUMENTS 190709 10/1984 Japan .

Primary Examiner—Stanley D. Miller
Assistant Examiner—Richard Roseen
Attorney, Agent, or Firm—Finnegan, Henderson, Farabow, Garrett & Dunner

[57] ABSTRACT

A phase shifter includes first and second mixers which mix a first signal with a second signal having a phase different from the first signal, respectively, third and fourth mixers which mix the second signal with the output signals of the first and second mixers and a combiner which combines the output signals of the third and fourth mixers to produce an output signal having a phase which is inverted with respect to the first signal.

3 Claims, 1 Drawing Figure

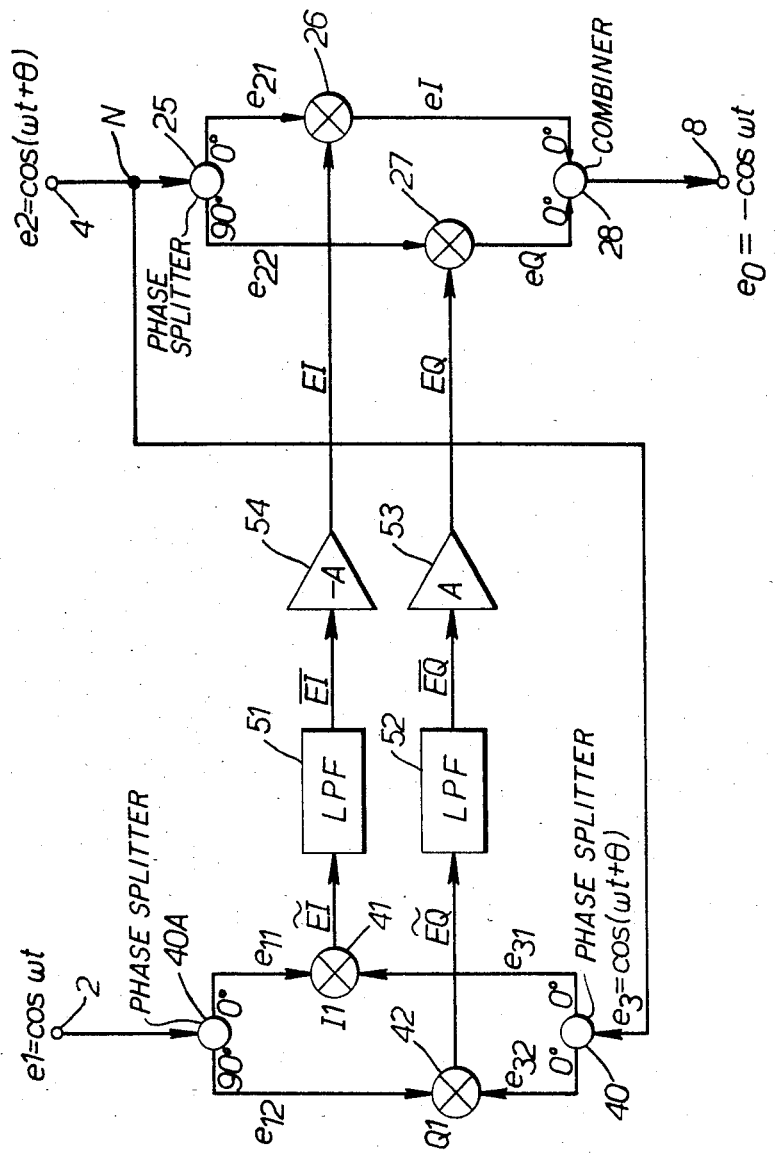

PHASE SHIFTER

BACKGROUND OF THE INVENTION

This invention relates to a phase shifter for generating a signal which has a phase opposite to that of another signal.

DESCRIPTION OF THE PRIOR ART

Conventional phase shifter circuits generally employ either a circuit using delay lines or a circuit using variable capacity diodes. However, the phase shift is stepwise in the former phase shifter, and the phase shift can be continuous but has a narrow range in the latter phase shifter.

As a result, in a case where a signal B is to have its phase inverted from that of another signal A, such a large phase shift is effected by a circuit employing a combination of delay lines and variable capacity diodes. Smaller phase shifts can be produced by a circuit employing variable capacity diodes alone. However, while phase shifters of the kind referred to above can be effective in producing variable phase shifts within a limited range, it is difficult to effect phase shifts which vary over a wide range with such circuits.

SUMMARY OF THE INVENTION

An object of this invention, therefore, is to provide a phase shifter for shifting one of two signals which have a phase difference from each other to allow it to have a phase opposite to that of the other signal.

In order to achieve the above object of the present invention, a phase shifter is provided comprising first and second terminals for receiving first and second signals having a phase difference from each other, first mixing means for mixing the first signal with the second signal, means for displacing the phase of the first signal by 90 degrees to produce a first phase-displaced signal, second mixing means for mixing the first phase-displaced signal with the second signal, third mixing means for mixing the second signal with an output signal provided from the first mixing means, means for displacing the phase of the second signal by 90 degrees to produce a second phase-displaced signal, fourth mixing means for mixing the second phase-displaced signal with an output signal provided from the second mixing means and combining means for combining an output signal of the third mixing means with an output signal provided from the fourth mixing means to generate a signal which has a phase opposite to that of the first signal.

BRIEF DESCRIPTION OF THE DRAWINGS

The accompanying drawing is a circuit diagram showing one embodiment of the phase shifter according to the present invention.

DESCRIPTION OF THE PREFERRED EMBODIMENT

An embodiment of a phase shifter according to the present invention will be described in the following with reference to the circuit diagram of the drawing.

First and second signals $e_1$ and $e_2$, which have different phases with respect to each other, are introduced from the terminals 2 and 4. The first signal $e_1$ is supplied to a 90 degrees phase splitter 40A and is divided thereby into two signals $e_{11}$ and $e_{12}$. Signal $e_{11}$ is in phase with the first signal $e_1$, while the phase of signal $e_{12}$ is displaced 90 degrees with respect to the first signal $e_1$. The signals $e_{11}$ and $e_{12}$ provided from the splitter 40A are supplied to a pair of balanced mixers 41 and 42, respectively. The signal $e_2$ which is split at a node N is supplied to an in-phase splitter 40 as a third signal $e_3$. This third signal $e_3$ is divided into two in-phase signals $e_{31}$ and $e_{32}$. These signals $e_{31}$ and $e_{32}$ are supplied to the mixers 41 and 42, respectively, and are mixed with the signals $e_{11}$ and $e_{12}$.

As a result, the mixed signals $\widetilde{EI}$ and $\widetilde{EQ}$, which have frequencies of the sum or difference of two signals introduced in the mixers 41 and 42, are provided from the mixers 41 and 42. The mixed signals $\widetilde{EI}$ and $\widetilde{EQ}$ and are fed through low-pass filters 51 and 52, respectively, to the amplifiers 54 and 53. The gain of amplifiers 54 and 53 is set $-A$ and $A$, respectively. Amplified outputs EI and EQ of the amplifiers 54 and 53 are supplied to the balanced mixers 26 and 27.

The signal $e_2$ supplied to the 90 degrees splitter 25 is divided into two signals $e_{21}$ and $e_{22}$. Signal $e_{21}$ is in phase with signal $e_2$, while signal $e_{22}$ is displaced 90 degrees with respect to signals $e_2$. Signals $e_{21}$ and $e_{22}$ are supplied to the balanced mixers 26 and 27, respectively.

In the mixers 26 and 27, the signal EI is mixed with E21 and signal EQ is mixed with $e_{22}$. The outputs eI, eQ of mixers 26 and 27 are combined by an in-phase combiner 28 so that an output signal $e_o$ is generated at output terminal 8.

Now, if the first and second signals $e_1$ and $e_2$ are defined by:

$$e_1 = \cos wt; \text{ and } e_2 = \cos(wt+\theta),$$

then the output $\widetilde{EI}$ of the mixer 41 is described by the following equation:

$$\widetilde{EI} = \cos wt \cdot \cos(wt + \theta)$$
$$= \tfrac{1}{2}\{\cos(-\theta) + \cos(2wt + \theta)\}$$

Hence, if the output voltage $\widetilde{EI}$ is passed through the low-pass filter 51, then the output voltage EI is obtained in the following equation:

$$EI = \tfrac{1}{2}\cos\theta$$

The output EI of the inverse amplifier 54 connected with the output terminal of the low-pass filter 51 is obtained in the following equation if its amplification is $-2$:

$$EI = -\cos\theta$$

On the other hand, the output voltage $\widetilde{EQ}$ generated by the mixer 42 is defined by the following equation:

$$\widetilde{EQ} = \cos\left(wt + \frac{\pi}{2}\right) \cdot \cos(wt + \theta)$$
$$= \tfrac{1}{2}\left\{\cos\left(\frac{\pi}{2} - \theta\right) + \cos\left(2wt + \frac{\pi}{2} + \theta\right)\right\}$$

Hence, if this voltage $\widetilde{EQ}$ is applied to the low-pass filter 52, the output voltage $\overline{EQ}$ is obtained in accordance with the following equation:

$$\overline{EQ} = \tfrac{1}{2} \cos\left(\theta - \tfrac{\pi}{2}\right)$$

$$= \tfrac{1}{2} \sin \theta$$

Applying this output of the low-pass filter 52 to the in-phase amplifier 53, the output $\overline{EQ}$ of the amplifier 53 is obtained in the following equation if its amplification is 2:

$$EQ = \sin \theta$$

Since the mixer 26 mixes the output EI with signal $e_{21}$, its output eI is expressed in the following equation:

$$eI = -\cos \theta \cdot \cos (wt + \theta)$$

On the other hand, since the mixer 27 mixes the output EQ with signal $e_{22}$, its output eQ is expressed in the following form:

$$eQ = \sin \theta \cdot \cos\left(wt + \theta + \tfrac{\pi}{2}\right)$$

$$= -\sin \theta \cdot \sin (wt + \theta)$$

After these outputs are combined by the combiner 28, the output $e_o$ is expressed in the following equation:

$$e_o = eI + eQ$$

$$= -\cos \theta \cdot \cos (wt + \theta) - \sin \theta \cdot \sin (wt + \theta)$$

$$= -\cos (wt + \theta - \theta) = -\cos wt$$

As a result, the output signal $e_o$ is controlled to have its phase inverted from that of the first signal $e_1$.

In this case gain of amplifier 54 may be made positive whereupon the signal $e_{21}$ should be supplied to the mixer 26 after its polarity has been reversed.

As has been described hereinbefore, according to the present invention, one of the two signals having a phase difference is shifted to have the opposite polarity in regardless with the phase of one signal.

It will be apparent to those skilled in the art that various modifications and variations could be made to the embodiment of the invention as hereinabove described without departing from the spirit and scope of the invention.

What is claimed is:

1. A phase shifter comprising:
    first and second terminals for receiving first and second signals having a phase difference from each other;
    first mixing means for mixing said first signal with said second signal;
    means for displacing the phase of said first signal by 90 degrees to produce a first phase-displaced signal;
    second mixing means for mixing said first phase-displaced signal with said second signal;
    third mixing means for mixing said second signal with an output signal provided from said first mixing means;
    means for displacing the phase of said second signal by 90 degrees to produce a second phase-displaced signal;
    fourth mixing means for mixing said second phase-displaced signal with an output signal provided from said second mixing means; and
    combining means for combining an output signal of said third mixing means with an output signal provided from said fourth mixing means to generate a signal which has a phase opposite to that of said first signal.

2. The phase shifter as defined in claim 1 wherein first and second low-pass filters and amplifiers in serial-relation to each other are inserted between said first mixer means and said third mixer means and between said second mixer means and said fourth mixer means, respectively.

3. The phase shifter as defined in claim 2 wherein said first and second amplifiers have inverse polarity gains with respect to each other.

* * * * *